United States Patent [19]
Sridharan et al.
[11] Patent Number: 5,019,938
[45] Date of Patent: May 28, 1991

[54] ENCLOSURE FOR AND/OR ENCLOSURE CONTAINING A BALLAST CIRCUIT

[75] Inventors: Sri P. Sridharan, Hickory Hills; Frank Jungman, Addison, both of Ill.

[73] Assignee: Radionic Industries Inc., Chicago, Ill.

[21] Appl. No.: 491,069

[22] Filed: Mar. 9, 1990

[51] Int. Cl.[5] ........................ H05K 5/02; H01F 15/02

[52] U.S. Cl. .................................... 361/377; 361/395; 361/399; 174/DIG. 2; 315/276

[58] Field of Search ................. 361/377; 174/DIG. 2; 315/276, 277

[56] References Cited

U.S. PATENT DOCUMENTS

| | | | |
|---|---|---|---|
| 4,719,540 | 1/1988 | San George et al. | 361/377 |
| 4,739,188 | 4/1988 | DeCandia et al. | 174/DIG. 2 X |
| 4,916,363 | 4/1990 | Burton et al. | 361/377 X |

*Primary Examiner*—Leo P. Picard
*Assistant Examiner*—Michael W. Phillips
*Attorney, Agent, or Firm*—Hill, Van Santen, Steadman & Simpson

[57] ABSTRACT

An enclosure for and/or enclosure containing a ballast circuit is substantially rectangular in shape and is subdivided into sections arranged in the following order: a first transformer section; a thermal protector section; a second transfer section; and a printed circuit board section, the thermal protector section comprising a pair of upstanding U-shaped channel members designed to securely receive thermal protectors and which serve as a barrier between the first and second transformer sections. The printed circuit board section and second transformer section are separated by means of an upstanding wedge-shaped rib employed to secure a printed circuit board in the circuit board sections.

20 Claims, 2 Drawing Sheets

FIG. 1
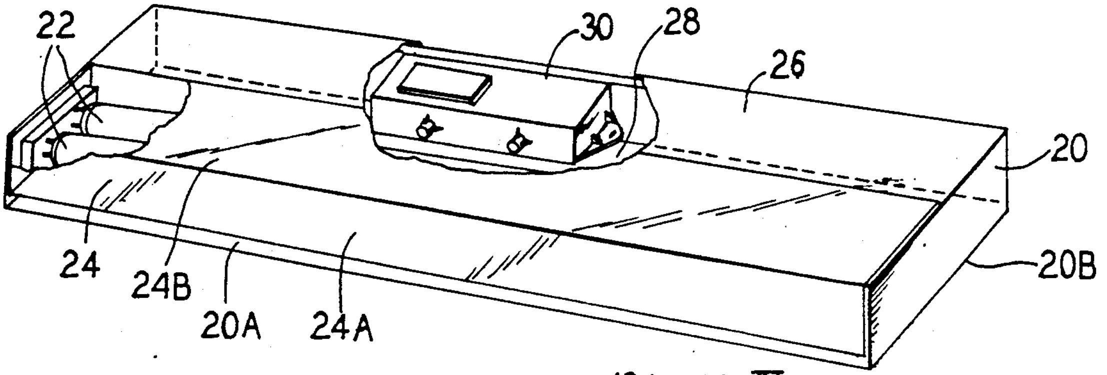
FIG. 2
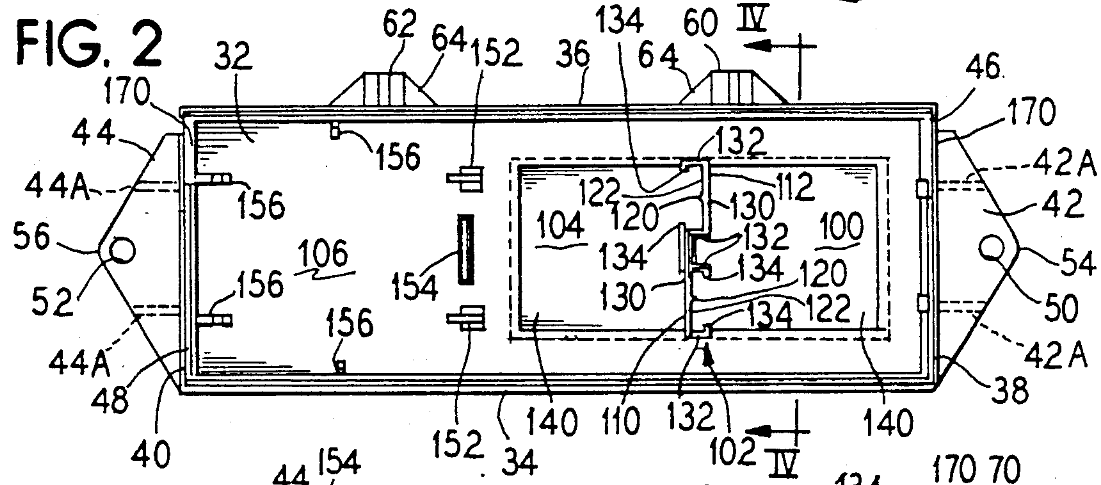
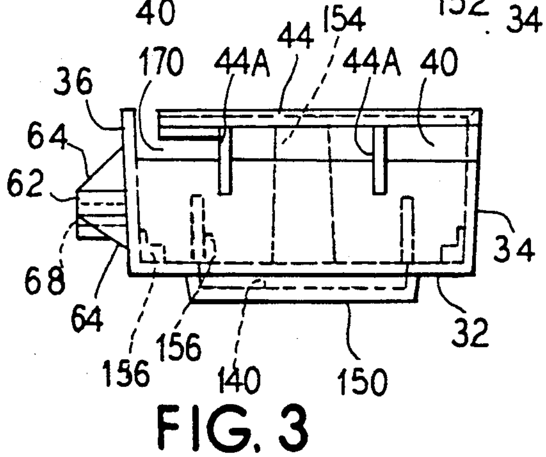
FIG. 3
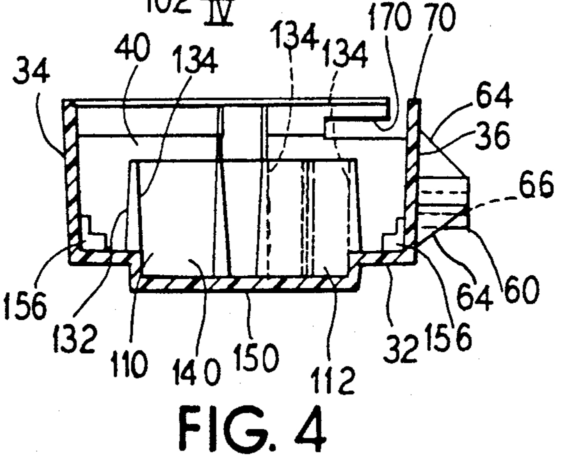
FIG. 4
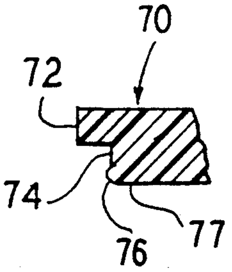
FIG. 5
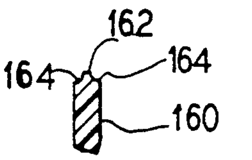
FIG. 6

ENCLOSURE FOR AND/OR ENCLOSURE CONTAINING A BALLAST CIRCUIT

BACKGROUND OF THE INVENTION

The present invention generally relates to ballast circuits for fluorescent lamps and the like. More specifically, the invention relates to an enclosure for a ballast circuit.

Ballast circuit enclosures are generally provided to house ballast circuits that are used to operate fluorescent lamps and the like. The enclosures generally are inefficiently assembled using messy potting compounds to hold components in place therein. Without the potting compounds, the components would rattle within the enclosure.

The assembly of ballast circuit systems generally requires a relatively large amount of time. The various electrical components must be placed within the enclosure and steps must be taken to ensure appropriate electrical connection and/or isolation.

Further, Underwriters Laboratories, a certifying entity whose certification is a de facto if not a de jure requirement before successful sales of a ballast enclosure can be made, requires enclosures and assembled circuits therein to meet several stringent tests relating to voltage capabilities and isolation of components. Generally, to meet these requirements, it is necessary to employ fish paper, volcanized fiber, and/or high dielectric electrical grade tapes, which can be expensive.

SUMMARY OF THE INVENTION

The present invention provides an improved enclosure for a ballast circuit for a lamp such as that disclosed in U.S. application Ser. No. 451,612, filed Dec. 18, 1989, the teachings of which are fully incorporated herein, wherein circuit components can be securely received within the enclosure without the need for messy potting compounds. Additionally, the invention provides an improved combination enclosure and ballast circuit for a lamp such as a fluorescent lamp.

To this end, the invention provides in an embodiment an enclosure for a ballast circuit including a rectangular housing divided into four sections by members positioned therein, which sections are aligned as follows from one end of the housing to the other: a first transformer section, a thermal protector section, a second transformer section, and a printed circuit board section; said first and second transformer sections including recesses within which are engaged coils of transformers, said thermal protector section comprising two upstanding channel members within which are received one or two thermal protectors, the printed circuit board section including upstanding ribs that extend from the one end of the housing and from a floor of the housing so as to receive in seated engagement a printed circuit board.

In another embodiment, the invention provides an enclosure containing a ballast circuit including a rectangular housing divided into four sections by members positioned therein, which are aligned as follows from one end to the other: a first transformer section, a thermal protector section, a second transformer section, and a printed circuit board section; said first and second transformer sections receiving therein first and second transformers and including recesses in a floor of said housing within which are received coils of said transformers, said thermal protector section being formed by two upstanding channel members within which are received thermal protectors, said printed circuit board section including upstanding ribs extending from the other end of said housing and from a floor of the housing adjacent said second transformer section, said printed circuit board section receiving therein in seated engagement a printed circuit board, said housing further including an upstanding wedged rib positioned between said printed circuit board section and said second transformer section so that the printed circuit board is received in wedged engagement within said printed circuit board section.

In another embodiment, the housing of the enclosure includes two mounting boss members positioned on one lateral wall of said housing.

In another embodiment, the housing includes stress relief openings formed in the longitudinal ends of said housing within which can be received wires coupling the ballast circuit to a power source.

An advantage of the invention is that the mounting of the enclosure is easily accomplished by simply engaging screws within the bosses.

Another advantage is the simple insertion of a printed circuit board within the printed circuit board section.

Another advantage is the mounting of various components within receiving members so that the components are not loosely mounted.

Another advantage is the ability to ultrasonically seal the entire housing.

Another advantage is that the use of a suitable high-grade plastic for the housing reduces the amount of leakage current from the circuit to ground to nearly zero.

Another advantage of the invention is the provision of a magnetic ballast for up to two lamps that is approximately 25% of the weight of a conventional magnetic ballast.

These and other features and advantages of the invention will become more apparent below with reference to the following detailed description of the presently preferred embodiments and the accompanying drawings.

BRIEF DESCRIPTION OF THE DRAWINGS

FIG. 1 is a perspective view of a lamp housing including a ballast circuit enclosure embodying principles of the invention.

FIG. 2 is a planar view of the enclosure of FIG. 1 sans cover.

FIG. 3 is an elevational view of the enclosure of FIGS. 1 and 2.

FIG. 4 is a cross-sectional, elevational view of the enclosure of FIG. 1 and taken along the line IV—IV of FIG. 2.

FIG. 5 is a detail of an edge of the enclosure of FIG. 4 as identified by circle V.

FIG. 6 is a cross-sectional view of a wedge member of the enclosure of FIG. 2 taken along the line VI—VI.

DETAILED DESCRIPTION OF THE PRESENTLY PREFERRED EMBODIMENTS

Figure 7:
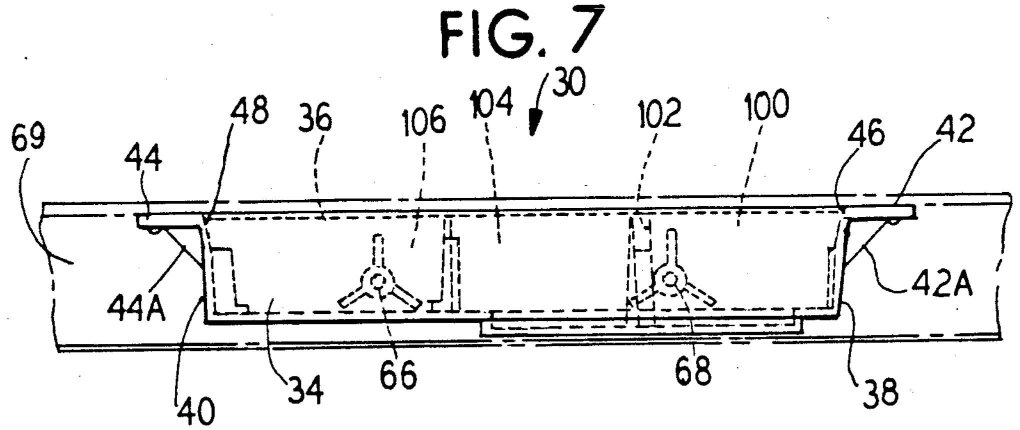
FIG. 7 is an elevational view of the enclosure of FIG. 1.

In FIG. 1, there is illustrated a fluorescent lamp housing 20 which is substantially rectangular in shape. Mounted within the housing 20 in side-by-side relationship along one longitudinal side of the housing 20 are two fluorescent lamps 22. A translucent cover 24 forming one longitudinal side and one half of a top face of the housing 20 is secured over the lamps 22 so as to allow light to be emitted therefrom.

An enclosure SO embodying principles of the invention is secured within the housing 20 in the longitudinal space not occupied by the lamps 22 and covered by an opaque cover 26. The enclosure 30 is substantially rectangular in shape and is mounted on a bottom panel 28 of the lamp housing 20.

As illustrated, the enclosure 30 is received within the housing 20 so as to be hidden from view. However, it can be appreciated that the construction illustrated in FIG. 1 is provided merely as an example and that the enclosure 30 is capable of being mounted in a variety of locations as is required for a particular housing.

The enclosure 30 is illustrated in greater detail in FIGS. 2-7. The enclosure 30 is particularly capable of housing a circuit, or two circuits, such as that disclosed in U.S. application Ser. No. 451,612, filed Dec. 18, 1989, fully incorporated herein.

With reference particularly to FIG. 2, the enclosure 30, being substantially rectangular in shape, includes a floor 32 and longitudinal upstanding walls 34 and 36 positioned on opposite edges of the floor 32 defining a longitudinal dimension. Similarly, the enclosure includes lateral upstanding walls 38 and 40 positioned on opposite edges of the floor 32 defining a lateral dimension which is orthogonal to the longitudinal dimension. The walls 34, 36, 38, and 40 and the floor 32 are operatively secured together to form a box having one open end, hereinafter referred to as the top of the enclosure 30.

It can be appreciated that the enclosure box 30 is formed via molding so as to be a unitary member. To that end, the enclosure 30 preferably is made of a suitable nonelectrically conductive material such as plastic.

Attached to the outside faces of the lateral walls 38 and 40, and preferably integrally or unitarily molded therewith are mounting flanges 42 and 44, respectively. The flanges 42 and 44 are substantially triangular in shape and are attached along top edges 46 and 48 or the walls 38 and 40, respectively. Each flange includes a suitable opening 50 and 52, respectively, for receipt therein of a stud or bolt. The opening 50 or 52 is positioned within the apex of the respective triangle defined by the flange 42 or 44. The corners of the triangles defined by the flanges 42 and 44 are rounded to remove any sharp edges.

The mounting flanges 42 and 44 include supporting ribs 42A and 44A, respectively, formed thereunder. As illustrated, the ribs 42A and 44A are substantially triangular in shape and fit within the corners defined by the flanges 42 and 44 and the respective lateral walls to which they are attached. The ribs 42A and 44A are aligned perpendicularly to their respective flanges.

As illustrated in FIG. 1, the flanges 42 and 44 serve to mount the enclosure 30 within the housing 20. It can be appreciated that prior to mounting, the enclosure 30 generally must be flipped so that the top side is placed adjacent the floor of the housing 20. Of course, other mounting schemes can be employed. For example, if suitably long bolts and/or studs are employed to extend through the flanges 42 and 44 to the floor of the housing 20, the enclosure 30 can be positioned with its floor 32 adjacent the floor of the housing 20.

Alternatively, one skilled in the art can readily devise a ballast circuit enclosure based on the principles disclosed herein wherein the flanges are positioned so as to extend from different edges, such as an edge of the floor 32.

The enclosure 30 also includes cylindrical mounting bosses 60 and 62 attached to, and preferably formed unitarily therewith, an outside face of longitudinal wall 36. Each boss includes triangular flanges 64 extending radially therefrom and attached to the wall 36 to provide lateral support to the boss. In FIG. 7, it can be seen that the bosses 60 and 62 include axial bores 66 and 68, respectively for threading receipt therein of suitable bolts or screws.

The provision of the bosses 62 and 64 permits the enclosure 30 to be mounted via lateral attachment of the enclosure 30 to a relatively vertical wall. Of course, other mounting schemes should be readily apparent to those of skill in the art.

In FIG. 7, it is illustrated how the bosses 60 and 62 are used to secure the fixture 30 to a wall 69, preferably an upstanding wall of a fixture.

The top edges of peripheries of the upstanding walls 34, 36, 40, and 42 of the enclosure 30 can be appreciated with reference to FIG. 5 wherein the top edge 70 of the wall 36 is detailed for exemplary purposes. In FIG. 5, it can be seen that the wall 36 includes a stepped construction at its upper edge 70 such that a relatively short upstanding flange 72 is formed on approximately the outer half thereof. A complementary shoulder 74 is then formed in approximately the inner half of the wall 36.

Because the remaining walls are similarly constructed, the enclosure includes a shoulder that rings the inner periphery of the top edge of the enclosure.

Further, a raised bead 76 is formed along an edge of the shoulder 76 face to the interior of the enclosure 30. This bead 76 is employed for ultrasonic welding of a rectangular cover panel (not illustrated) to the enclosure 30, which cover panel is received on the rectangular shoulder defined by the shoulder 76 and the similar shoulders formed on the other walls 34, 38, and 40. The bead, of course, can be removed if the cover is only to be secured via adhesive or the like.

With reference again to FIGS. 2 and 7, it can be seen that the space enclosed by the enclosure 30 is generally subdivided into four sections/spaces from the lateral wall 38 (longitudinal end) to the other lateral wall 40: a first transformer section 100, a thermal protector section 102, a second transformer section 104, and a circuit board section 106. This subdividing is the result of the selected positioning of various receptacles and securing members within the enclosure 30 in accordance with the invention. It can be appreciated that the nomenclature for the various sections derives from the components of the ballast circuit which t he sections are designed to accommodate.

The first and second transformer sections 100 and 104, respectively, are separated by upstanding channel members 110 and 112 that form the thermal protector space 102.

As best seen in FIGS. 2 and 4, the channel members 110 and 112 that define the thermal protector section 102 essentially comprise two rectangular U-shaped channels that project upward from the floor 32 of the enclosure 30. The U-shaped channels 110 and 112 are positioned so that the open faces thereof face in opposite direction, i.e., one faces the first transformer section 100 while the other faces the second transformer section 104.

The U-shaped channel members 110 and 112 preferably are spaced apart but attached to each other along adjacent lateral edges so as to form a wall structure/barrier between the transformer sections 100 and 104. The channels are preferably spaced apart to enable positioning of thermal protectors therein in a manner to isolate contacts of the thermal protectors that extend upward therefrom because, as will become clear below, uninsulated wires are used to couple thermal protectors to a circuit board received within the circuit board space 106.

As can be seen most clearly in FIG. 2, each of the U-shaped channels 110 and 112 includes a projecting bump or nub 120 positioned along the interior face of a wall 122 forming the bottom of the U of the channel. This bump or nub 120 serves to securely wedge a thermal protector received in the channel.

Each of the U-shape channels 110 and 112 is formed to include an upright a wall 130 to which are attached two lateral walls 132. The walls 132 extend perpendicularly to the upright wall and include inwardly directed flanges 134 which provide shoulders oppositely facing the upright wall 130.

As described, each of the U-shaped channels 110 and 112 is thus formed so that a substantially rectangular member can be received therein and have each surface engaging an interior face or shoulder of the channel.

Beneath the first and second transformer sections 100 and 104 there is formed a well or recess 140 that is designed to accommodate therein coils of transformers. To, this end, the floor panel 32 preferably is molded to include a rectangular dropped floor portion 150 just beneath the first and second transformer sections 100 and 104. The upstanding U-shaped channels bisect the dropped floor portion 150 in bridging fashion and thus form a barrier separating the first and second transformer sections 100 and 104.

Separating the second transformer section 104 and the printed circuit board section 106 are a pair of upstanding ribs or vanes 152 and a wedge-shaped rib or vane 154 positioned therebetween. The ribs 152 and 154 extend perpendicularly from the floor 32 and form a barrier of sorts delineating a border between the two sections 104 and 106.

As illustrated, the wedge-shaped rib 154 is aligned to have its widest surface parallel to the lateral walls 38 and 40. The ribs 152 are aligned perpendicularly thereto.

A plurality of ribs 156 are positioned about the printed circuit board section 106 to provide a seat within which a circuit board can be placed. To this end, the ribs 156 are secured within the corners defined by the floor 32 and the longitudinal walls 34 and 36 and the lateral wall 38. The ribs 156 and the ribs 152 are constructed substantially in L-shapes, so that a circuit board can be supported above the floor 32. The ribs 152, 154, and 156 thus are arranged to support various lateral edges of a board.

The wedged rib 154 is provided to engage against the edge of a circuit board received on the ribs 152 to thereby secure the circuit board in the printed circuit board section 106 by exerting wedging forces thereon.

It can be appreciated that because the width of the wedge shape of the rib 154 is larger at its base attached to the floor 32, the wedging forces increase as the circuit board is pushed further onto the shoulders of the L-shaped ribs 152 and 156.

In FIG. 6, a top edge portion 160 of the wedged rib 154 is illustrated. As can be seen, the top edge 160 is constructed so that a short upstanding ridge 162 extends along the middle of the top edge 160. The top edge 160 thus includes two shoulders 164 on opposite sides of the ridge 162. This shape is provided for ultrasonic welding as the ridge 162 is a bead that melts to secure the rib 154 to a cover secured to the enclosure 30.

As can be seen best in FIGS. 2-4, the enclosure 30 includes stress relief slots 170 formed by removing portions of the upper edges of the walls 38 and 40, which portions extend between the wall 36 and the mounting flange ribs 42A and 44A nearest to the wall 36. The removed portions extend beneath the mounting flanges 42 and 44.

When the enclosure 30 is assembled and the cover is secured thereto, the stress relief slots accommodate wires and the like coupling components within the enclosure to the remainder of the circuitry for lamp operation such as power supply wiring. Because of the slots 170, strain is not exerted on the walls of the enclosure 30 by the wires.

Figure 8:
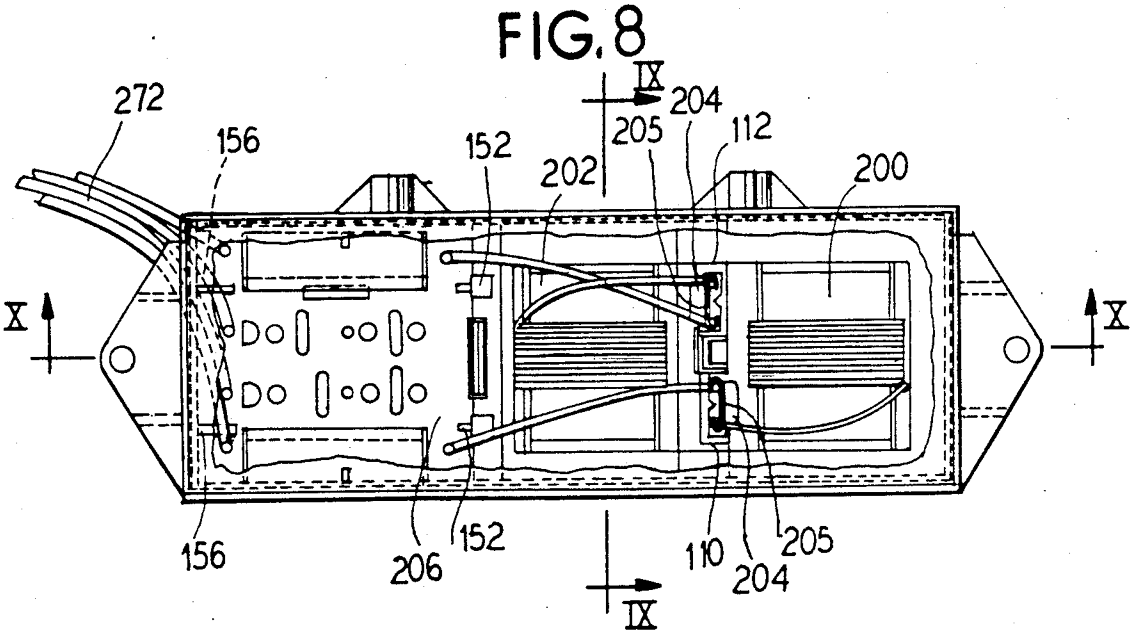
FIG. 8, is a plan view of the enclosure of FIGS. 1 and 2 complete with ballast circuit sans cover.
Figure 9:
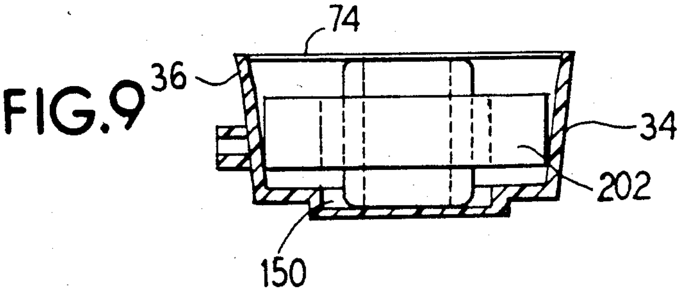
FIG. 9 is a cross-sectional, elevational view of the enclosure of FIG. 8 taken along the line IX—IX.
Figure 10:
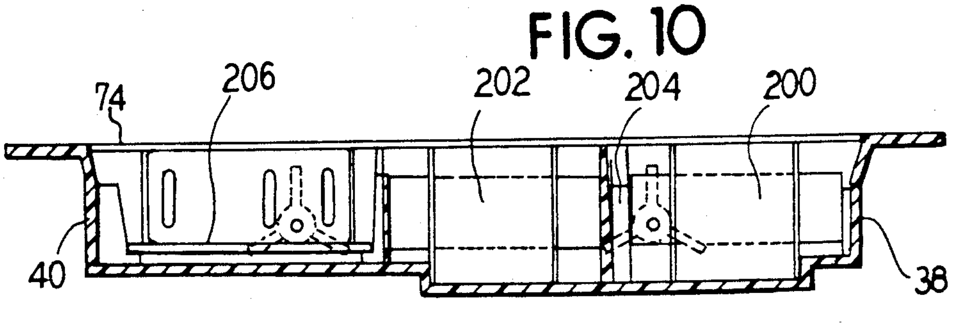
FIG. 10 is a cross-sectional, elevational view of the enclosure of FIG. 8 taken along the line X—X.

In FIGS. 8-10, it can be seen how first and second transformers 200 and 202, respectively, thermal protectors 204 with attached heat sink bases 205, and circuit board 206 are received within their respective sections. The thermal protectors 204 are held within the U-shaped channels 110 and 112 such that the movement thereof is minimized, thereby avoiding rattling of the thermal protectors 204 when everything is assembled. The first and second transformers 200 and 202 are received such that the coils thereof are accommodated within the recesses/pockets provided by the dropped floor portion 150.

A printed circuit board 206 containing components of a suitable circuit is received within its section 106. The board 210 is seated on top of the shoulders of the L-shaped ribs 152 and 158 and is securely held thereon by the wedge-shaped rib 154.

Wires 272 extend through one of the stress relief slots to couple the circuit to the remainder of the ballast circuitry required to operate the lamps.

It can be appreciated from the foregoing that the enclosure construction makes assembly of a ballast system for one or two lamps easy by providing individual slots and sections for components of the circuit without the need for tooling special enclosures. No messy potting compounds are required to secure the various circuit components in place. Further, the ballast circuit need not be assembled using fish paper, volcanized fiber, and/or expensive high dielectric electrical grade tapes. The assembled circuit consistently can withstand high voltages because adequate spacings between line and dead parts are ensured.

Further, the positioning of the thermal protectors 204 is such that heat dissipation is enhanced and made more efficient. Heat is transferred via the heat sinks 205 on the one side and through the respective channel openings to the transformers which the channels face. This ensures proper tripping of the protectors at the desired temperatures.

The enclosure 30 preferably is made of a suitable grade of plastic such as those sold under the trademarks KJB or NORYL. This type of material reduces leakage current to ground virtually to zero. Further, the weight of the enclosure and circuit, even for two lamps, is only 25% of the weight of an enclosure and circuit for conventional magnetic ballasts.

We claim:

1. A ballast circuit enclosure being substantially rectangular in shape and being subdivided into four sections arranged in the following order: a first transformer section; a thermal protector section; a second transformer section; and a printed circuit board section, said thermal protector section being formed by aligned upstanding U-shaped channel members, which also serve to separate said first and second transformer sections, said second transformer section and said printed circuit board sections being separated by upstanding ribs which also serve to support a printed circuit board.

2. The ballast circuit enclosure of claim 1, wherein said first and second transformer sections include recesses in said floor panel within which are accommodated coils of transformers.

3. The ballast circuit enclosure of claim 1, wherein said enclosure includes a ultrasonic welding bead formed along a top periphery thereof.

4. The ballast circuit enclosure of claim 1, further comprising mounting flanges extending from said opposite lateral walls.

5. The ballast circuit enclosure of claim 1, further comprising stress relief slots formed in some of said walls through which wires extending between inside and outside said enclosure can be accommodated.

6. The ballast circuit enclosure of claim 1, wherein said floor panel and walls are unitarily molded together.

7. A combination ballast circuit and enclosure therefor, said enclosure comprised in a substantially rectangular closure being divided into sections aligned from one end of said box to another, said sections being aligned as follows:

a first transformer section;

a thermal protector section;

a second transformer section; and a printed circuit board section, said thermal protector section comprising upstanding U-shaped channel members which also serve to form a barrier separating said first and second transformer sections, said printed board section and said second transformer section being separated by means of upstanding ribs which also serve to secure a printed circuit board of said ballast circuit in said printed circuit board section.

8. The combination of claim 7, wherein said enclosure includes mounting flanges extending from outside of walls located longitudinal ends of said box.

9. The combination of claim 7, wherein said box includes mounting bosses attached along one wall thereof.

10. The combination of claim 7, wherein said box includes stress release slots formed therein within which are accommodated wires extending between an inside of said box to an outside of said box.

11. The combination of claim 7, wherein said box is formed of a plastic material.

12. The combination of claim 7, wherein thermal protector members are received within said U-shaped upstanding channel members and first and second transformers are received within said first and second transformer sections, respectively, said transformers and thermal protectors being operatively coupled to a printed circuit board received within said printed circuit board section.

13. The combination of claim 12, wherein said box includes said recessed portions in said first and second transformer sections within which coils of said first and second transformers are received.

14. The combination of claim 7, wherein one of said upstanding ribs separating said second transformer section and said printed circuit board section is wedged shaped.

15. A substantially rectangular shaped ballast circuit enclosure, comprising a floor panel to which are operatively attached along opposite lateral edges of said floor panel two upstanding longitudinal walls and to which are attached along opposite longitudinal edges of said floor panel two upstanding lateral walls, said enclosure being divided into four sections aligned in a row from one lateral wall to the other, said first and third sections being separated by a barrier forming said second section, said second section comprising two upstanding U-shaped channel members, said third and fourth section being separated by means of upstanding ribs.

16. Enclosure of claim 15, further comprising outwardly extending mounting flanges attached to said lateral walls.

17. The enclosure of claim 15, further comprising mounting bosses attached to one of said walls.

18. The enclosure of claim 15, wherein said lateral walls include recesses formed along top edges thereof.

19. The enclosure of claim 15, wherein said longitudinal lateral walls include a bead formed along a top periphery thereof, said bead appropriately melting upon ultrasonic welding of a cover to said top periphery.

20. The enclosure of claim 15, wherein said lateral and longitudinal walls include a shoulder formed about an inner periphery which defines a recess within which a cover panel is received.

* * * * *